(12) United States Patent
Nakamura et al.

(10) Patent No.: US 12,345,982 B2
(45) Date of Patent: *Jul. 1, 2025

(54) DISPLAY DEVICE

(71) Applicant: JAPAN DISPLAY INC., Tokyo (JP)

(72) Inventors: Tenfu Nakamura, Tokyo (JP); Kentaro Okuyama, Tokyo (JP); Kojiro Ikeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/758,863

(22) Filed: Jun. 28, 2024

(65) Prior Publication Data

US 2024/0353712 A1    Oct. 24, 2024

Related U.S. Application Data

(63) Continuation of application No. 18/224,401, filed on Jul. 20, 2023, now Pat. No. 12,025,881, which is a (Continued)

(30) Foreign Application Priority Data

Jan. 21, 2021  (JP) .................................. 2021-008035

(51) Int. Cl.
  *G02F 1/13357*    (2006.01)
  *G02F 1/1334*    (2006.01)
  (Continued)

(52) U.S. Cl.
  CPC ...... *G02F 1/133615* (2013.01); *G02F 1/1334* (2013.01); *G02F 1/133616* (2021.01);
  (Continued)

(58) Field of Classification Search
  None
  See application file for complete search history.

(56) References Cited

U.S. PATENT DOCUMENTS 11,073,652 B2    7/2021  Numata
11,360,256 B2    6/2022  Numata
(Continued)

FOREIGN PATENT DOCUMENTS

JP    2011-107229 A    6/2011
JP    2019-032411 A    2/2019
(Continued)

OTHER PUBLICATIONS

International Search Report issued in International Patent Application No. PCT/JP2022/001739 on Apr. 12, 2022 and English translation of same. 6 pages.

(Continued)

*Primary Examiner* — Dung T Nguyen
(74) *Attorney, Agent, or Firm* — K&L Gates LLP

(57) ABSTRACT

According to one embodiment, a display device including a liquid crystal layer containing strip-like polymers and liquid crystal molecules, a third transparent substrate, and a transparent layer disposed on the third transparent substrate and having a refractive index lower than that of the third transparent substrate, wherein the transparent layer includes strip portions which include first and second end portions, and a middle portion, the first end portion has a first width greater than a width of the middle portion, the second end portion has a second width greater than the width of the middle portion, and first wiring lines overlap the strip portions, respectively and extend in a same direction.

20 Claims, 16 Drawing Sheets

Related U.S. Application Data continuation of application No. PCT/JP2022/001739, filed on Jan. 19, 2022.

(51) Int. Cl.
    *G02F 1/1335*     (2006.01)
    *G02F 1/1362*     (2006.01)
    *H10D 86/40*     (2025.01)
    *H10D 86/60*     (2025.01)

(52) U.S. Cl.
    CPC ..... *G02F 1/136286* (2013.01); *H10D 86/441* (2025.01); *H10D 86/60* (2025.01)

(56) References Cited

U.S. PATENT DOCUMENTS

| | | |
|---|---|---|
| 11,543,580 B2 | 1/2023 | Numata |
| 11,747,544 B2 | 9/2023 | Numata |
| 12,025,881 B2 * | 7/2024 | Nakamura ........ G02F 1/133606 |
| 2011/0116013 A1 | 5/2011 | Sano et al. |
| 2019/0041673 A1 | 2/2019 | Numata et al. |
| 2019/0079240 A1 | 3/2019 | Hwang et al. |
| 2019/0302496 A1 | 3/2019 | Okuyama |
| 2021/0132279 A1 | 5/2021 | Numata et al. |

FOREIGN PATENT DOCUMENTS

| | | |
|---|---|---|
| JP | 2019-174531 A | 10/2019 |
| JP | 2020-016724 A | 1/2020 |

OTHER PUBLICATIONS

Written Opinion issued in International Patent Application No. PCT/JP2022/001739 on Apr. 12, 2022. 4 pages.

* cited by examiner

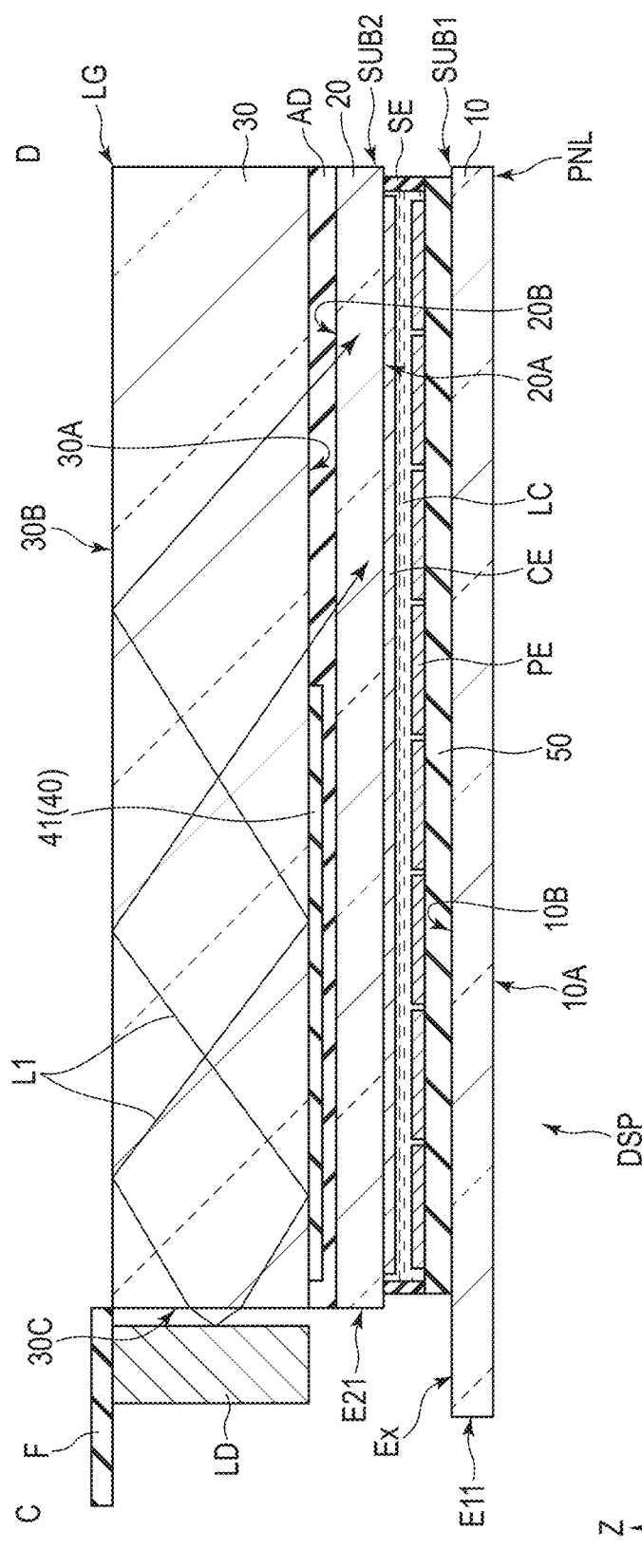
F I G. 6

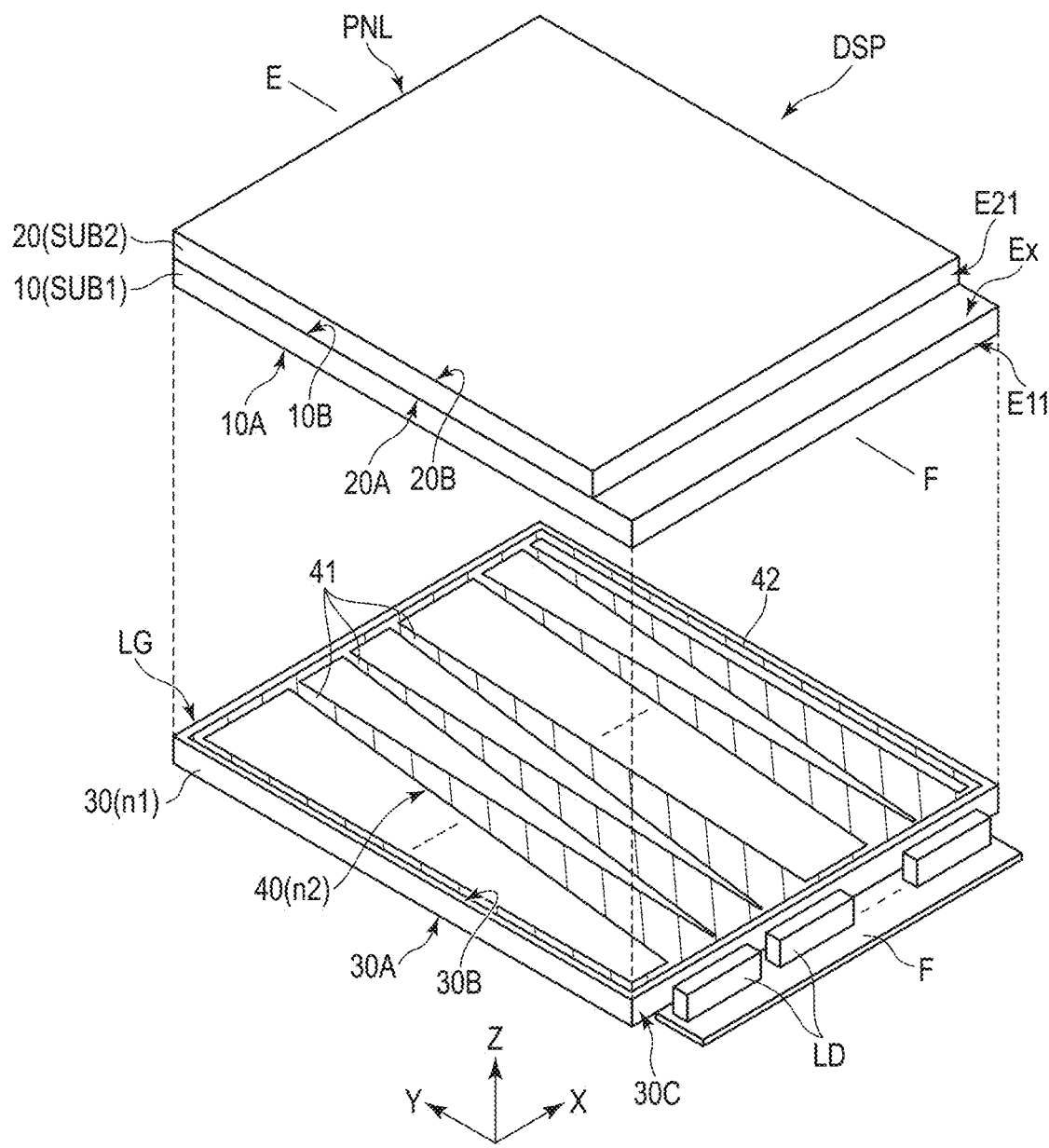
F I G. 11

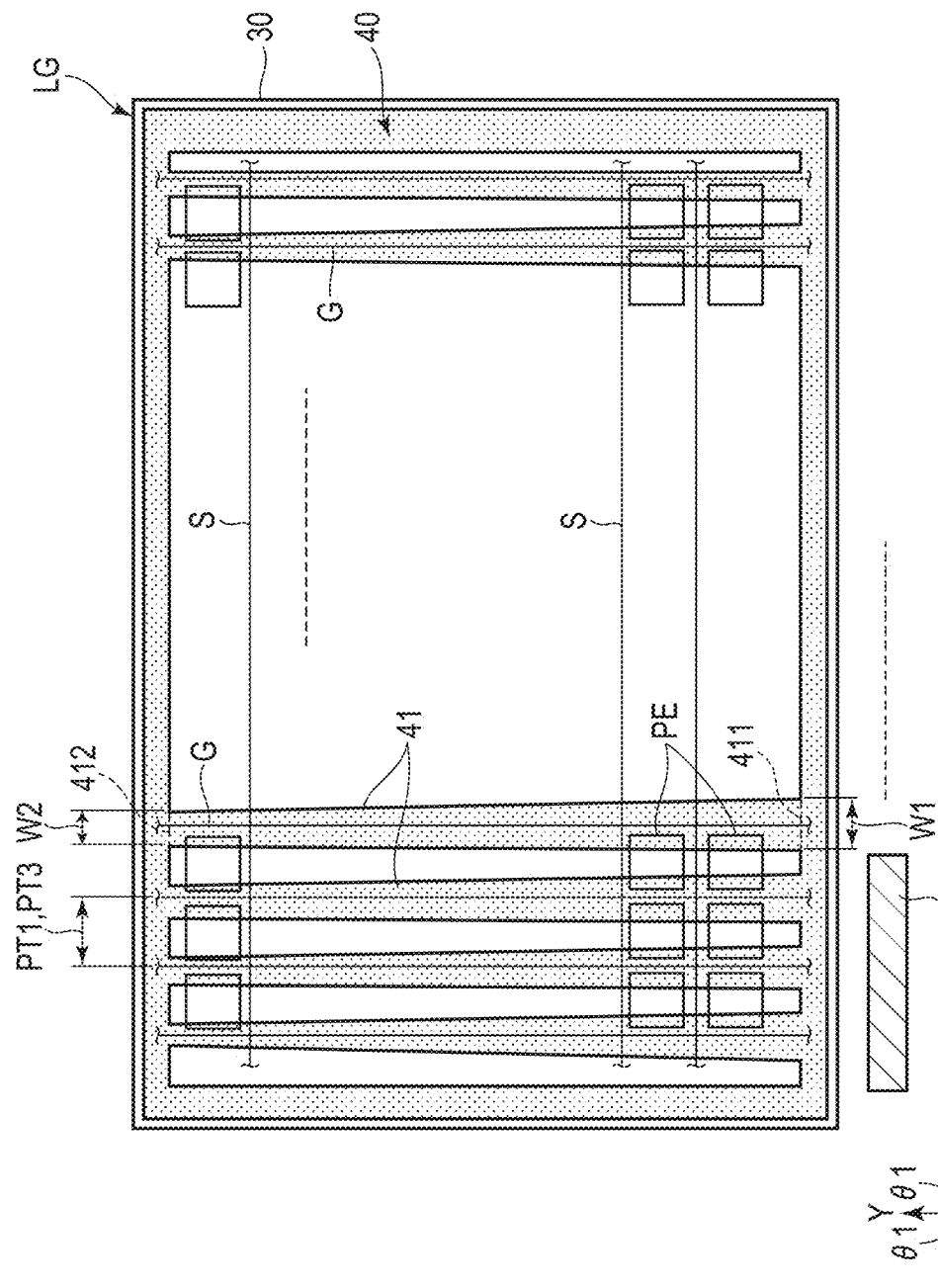
F I G. 13

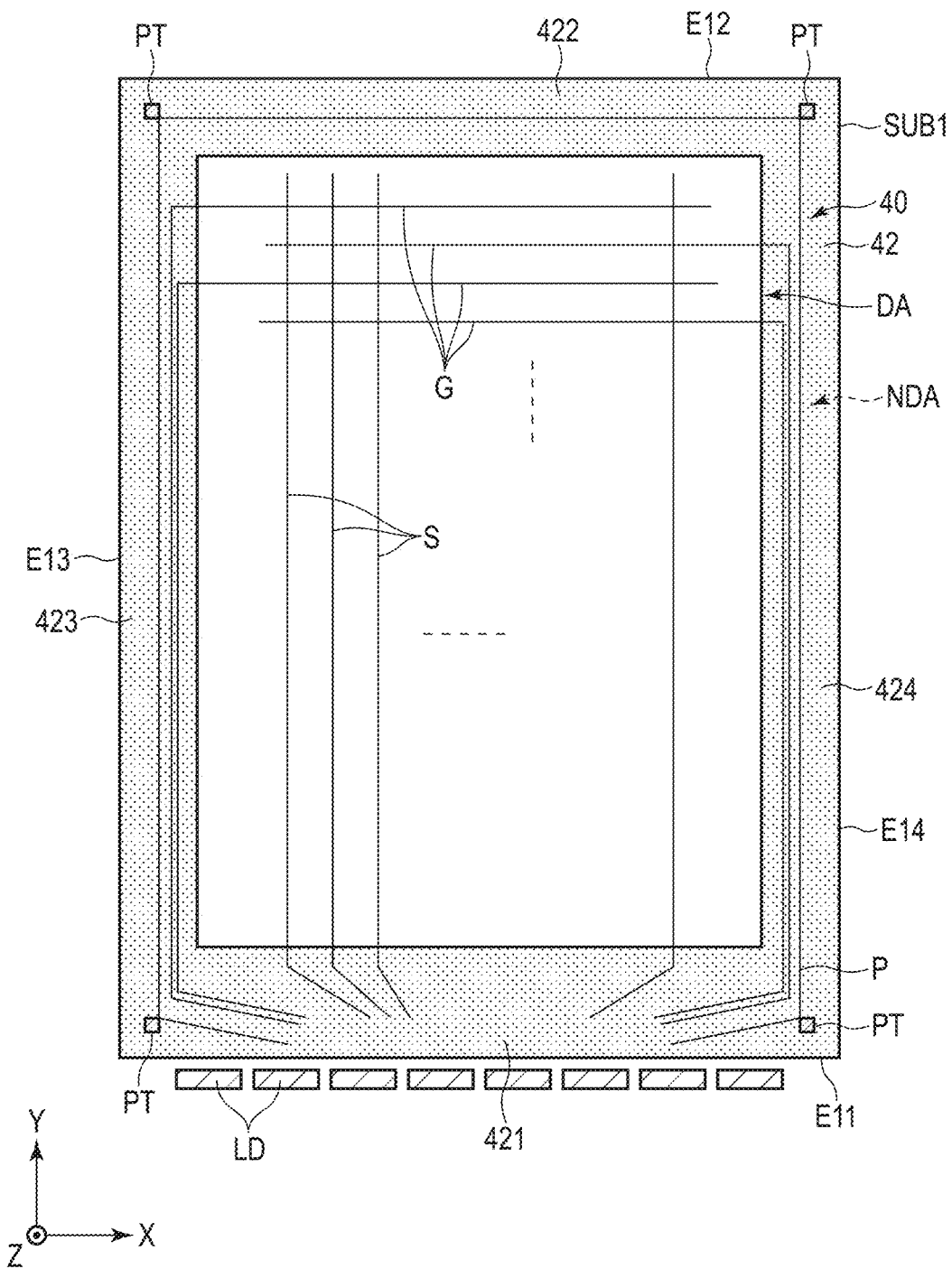
F I G. 15

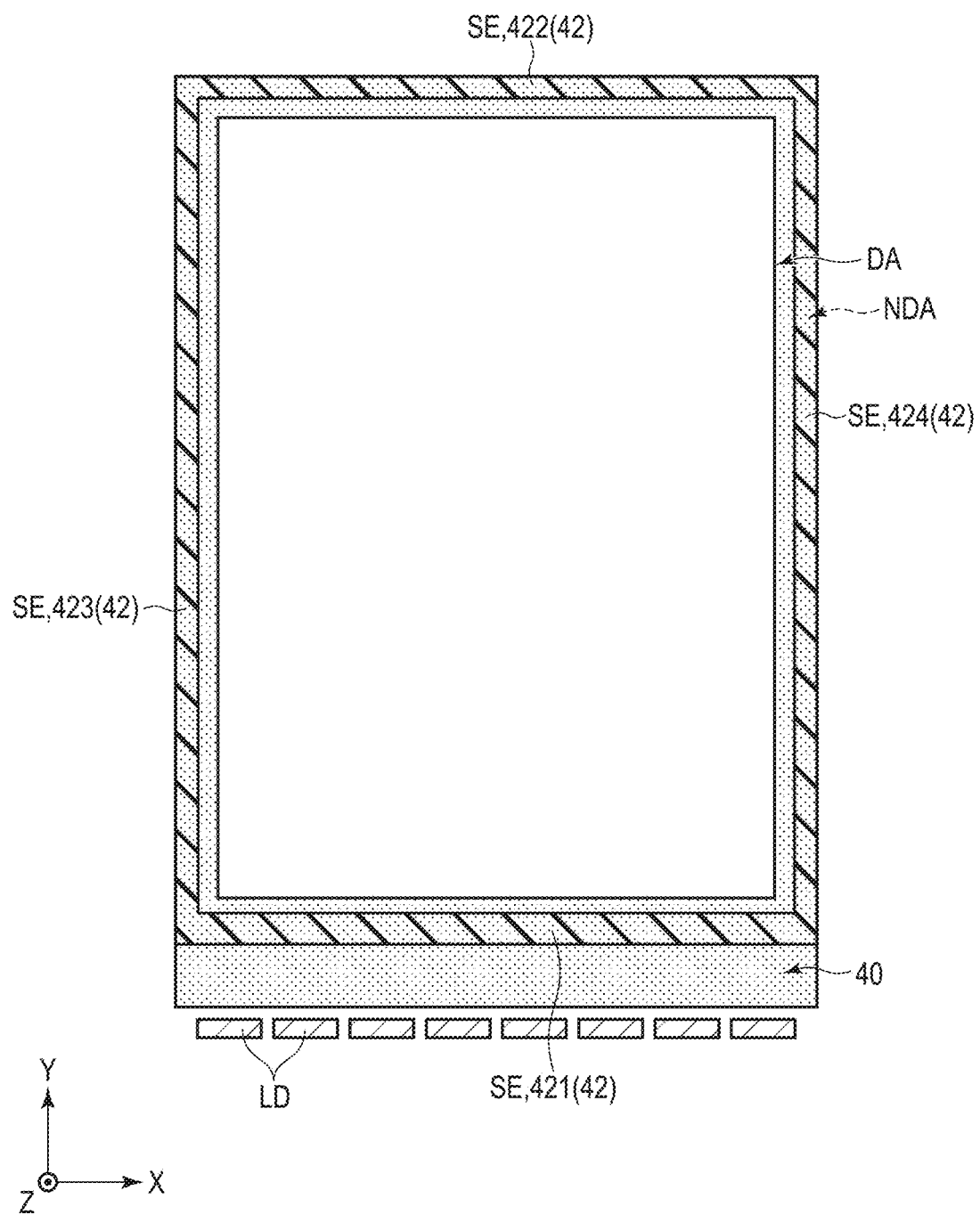
F I G. 16

DISPLAY DEVICE

CROSS-REFERENCE TO RELATED APPLICATIONS

This application is a Continuation Application of U.S. Application Ser. No. 18/224,401, filed on Jul. 20, 2023, which is a Continuation Application of PCT Application No. PCT/JP2022/001739, filed Jan. 19, 2022 and based upon and claiming the benefit of priority from Japanese Patent Application No. 2021-008035, filed Jan. 21, 2021, the entire contents of all of which are incorporated herein by reference.

FIELD

Embodiments described herein relate generally to a display device.

BACKGROUND

A display device that can switch between a scattering state, in which incident light is scattered, and a transmission state, in which incident light is transmitted, using polymer dispersed liquid crystal (PDLC), has been proposed. This technique has been proposed to prevent background reflection, and switches between transmission and scattering by apply voltage partially to PDLC. For transparent display devices that use PDLC, an edge light type in which light sources are displaced at an end portion of the light guide, is employed. However, the employment of the edge light type in PDLC display devices entails such a drawback that the luminance decreases as the location is away from the light sources.

BRIEF DESCRIPTION OF THE DRAWINGS

FIG. 6 is a cross-sectional view schematically showing a part of the display device taken along line C-D shown in FIG. 4.

FIG. 11 is an exploded schematic view showing another configuration example of the display device shown in FIG. 3.

FIG. 13 is a plan view showing another configuration example of the light guide element shown in FIG. 4.

FIG. 15 is a plan view showing a configuration example of a state where a transparent layer and a first substrate overlap each other.

FIG. 16 is a plan view showing a configuration example of a state where the transparent layer and a sealant overlap each other.

DETAILED DESCRIPTION

Figure 1:
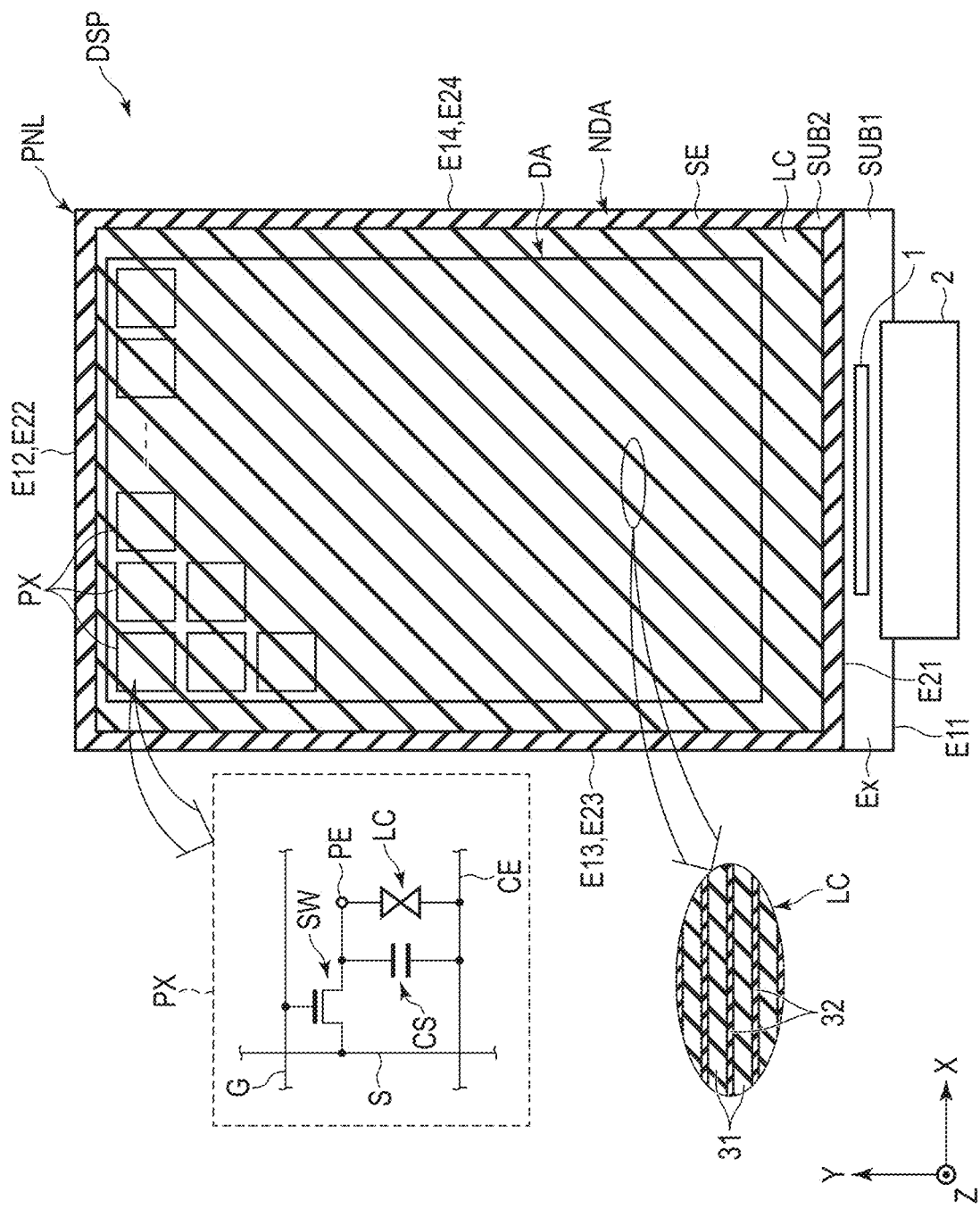
FIG. 1 is a plan view showing a configuration example of a display device of an embodiment.

In general, according to one embodiment, a display device comprises a first substrate comprising a first transparent substrate, a plurality of first wiring lines aligned along a first direction and extending in a second direction intersecting the first direction, switching elements electrically connected to the first wiring lines, respectively and pixel electrodes electrically connected to the switching elements, respectively, a second substrate comprising a second transparent substrate and a common electrode opposing the pixel electrode, a liquid crystal layer held between the first substrate and the second substrate and containing strip-like polymers and liquid crystal molecules, a plurality of light emitting elements aligned along the first direction and a light guide element comprising a third transparent substrate including a main surface and a side surface opposing the plurality of light emitting elements and a transparent layer disposed on the main surface and having a refractive index lower than that of the third transparent substrate, and the third transparent substrate is bonded to the first transparent substrate or the second transparent substrate while interposing the transparent layer therebetween, the transparent layer comprising a plurality of strip portions aligned along the first direction and extending in the second direction, and the plurality of first wiring lines overlapping the plurality of strip portions, respectively and extending in a same direction.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a plan view schematically showing a configuration example of a display device DSP of an embodiment.

For example, a first direction X, a second direction Y and a third direction Z are orthogonal to each other, but may intersect at an angle other than 90 degrees. The first direction X and the second direction Y correspond to directions parallel to the main surface of the substrate that constitutes the display device DSP, and the third direction z corresponds to the thickness direction of the display device DSP. In this specification, the direction from a first substrate SUB1 towards a second substrate SUB2 is referred to as "upper side" (or simply above), and the direction from the second substrate SUB2 towards the first substrate SUB1 is referred to as "lower side" (or simply below). With such expressions as the "second member above the first member" and the "second member below the first member", the second member may be in contact with the first member or separated from the first member. When it is assumed that there is an observation position to observe the display device DSP at the tip of the arrow indicating the third direction Z, viewing from this observation position toward the X-Y plane defined by the first direction X and the second direction Y is referred to as plan view.

In this embodiment, a liquid crystal display device in which polymer dispersed liquid crystals are applied will be described as an example of the display device DSP. The display device DSP comprises a display panel PNL, an IC chip 1 and a wiring board 2.

The display panel PNL comprises a first substrate SUB1, a second substrate SUB2, a liquid crystal layer LC and a seal SE. The first substrate SUB1 and the second substrate SUB2 are formed as flat plates parallel to the X-Y plane. The first substrate SUB1 and the second substrate SUB2 are superimposed, in plan view. The first substrate SUB1 and the second substrate SUB2 are bonded by a seal SE. The liquid crystal layer LC is held between the first substrate SUB1 and the second substrate SUB2 and sealed by the seal SE. In FIG. 1, the liquid crystal layer LC and the seal SE are shown with different shaded lines.

As enlarged and schematically shown in FIG. 1, the liquid crystal layer LC comprises polymer dispersed liquid crystals containing polymers 31 and liquid crystal molecules 32. For example, the polymers 31 are liquid crystalline polymers. The polymers 31 are formed into a stripe shape extending along the first direction X. The liquid crystal molecules 32 are dispersed in gaps among the polymers 31 and are aligned such that their long axes are along the first direction X. Each of the polymers 31 and the liquid crystal molecules 32 has an optical anisotropy or refractive index anisotropy. The responsivity of the polymers 31 to an electric field is lower than the responsivity of the liquid crystal molecules 32 to an electric field.

For example, the alignment direction of the polymers 31 does not substantially change regardless of with or without an electric field. On the other hand, the alignment direction of the liquid crystal molecules 32 changes in response to an electric field while a voltage higher than the threshold is being applied to the liquid crystal layer LC. When no voltage is being applied to the liquid crystal layer LC, the optical axes of the polymers 31 and the liquid crystal molecules 32 are parallel to each other, and light incident on the liquid crystal layer LC is transmitted without being scattered at all in the liquid crystal layer LC (transparent state). While voltage is being applied to the liquid crystal layer LC, the optical axes of the polymers 31 and the liquid crystal molecules 32 cross each other, and light incident on the liquid crystal layer LC is scattered within the liquid crystal layer LC (scattered state).

The display panel PNL comprises a display area DA for displaying images and a frame-like non-display area NDA which surrounds the display area DA. The seal SE is located in the non-display area NDA. The display area DA comprises pixels PX arranged in a matrix along the first direction X and the second direction Y.

As enlargedly shown in FIG. 1, each of the pixels PX comprises a switching element SW, a pixel electrode PE, a common electrode CE, a liquid crystal layer LC and the like. The switching element SW is constituted by a thin-film transistor (TFT), for example, and is electrically connected to a scanning line G and a signal line S. The scanning line G is electrically connected to the switching element SW in each of the pixels PX aligned along the first direction X. The signal line S is electrically connected to the switching element SW in each of the pixels PX aligned along the second direction Y. The pixel electrode PE is electrically connected to the switching element SW. Each of the pixel electrodes PE opposes the common electrode CE, and drives the liquid crystal layer LC (in particular, the liquid crystal molecules 32) by the electric field generated between the pixel electrode PE and the common electrode CE. The capacitor CS is formed, for example, between an electrode at the same potential as that of the common electrode CE and another electrode at the same potential as that of the pixel electrode PE.

The first substrate SUB1 includes edge portions E11 and E12 extending along the first direction X and edge portions E13 and E14 extending along the second direction Y. The second substrate SUB2 has edge portions E21 and E22 extending along the first direction X and edge portions E23 and E24 extending along the second direction Y. In the example shown in FIG. 1, the edge portions E12 and E22, the edge portions E13 and E23, and the edge portions E14 and E24 overlap each other, respectively in plan view, but they may not overlap. The edge portion E21 is located between the edge portion E11 and the display area DA in plan view. The first substrate SUB1 includes an extending portion Ex between the edge portion E11 and the edge portion E21.

The IC chip 1 and the wiring board 2 are each connected to the extending portion Ex. The IC chip 1 contains, for example, a display driver that outputs signals necessary for image display, built therein. The wiring board 2 is a flexible printed circuit board that can be bent. Note that the IC chip 1 may be connected to the wiring board 2. The IC chip 1 and the wiring board 2 function primarily as a signal source that supplies signals to the display panel PNL, though they may be read out signals from the display panel PNL in some cases.

Figure 2:
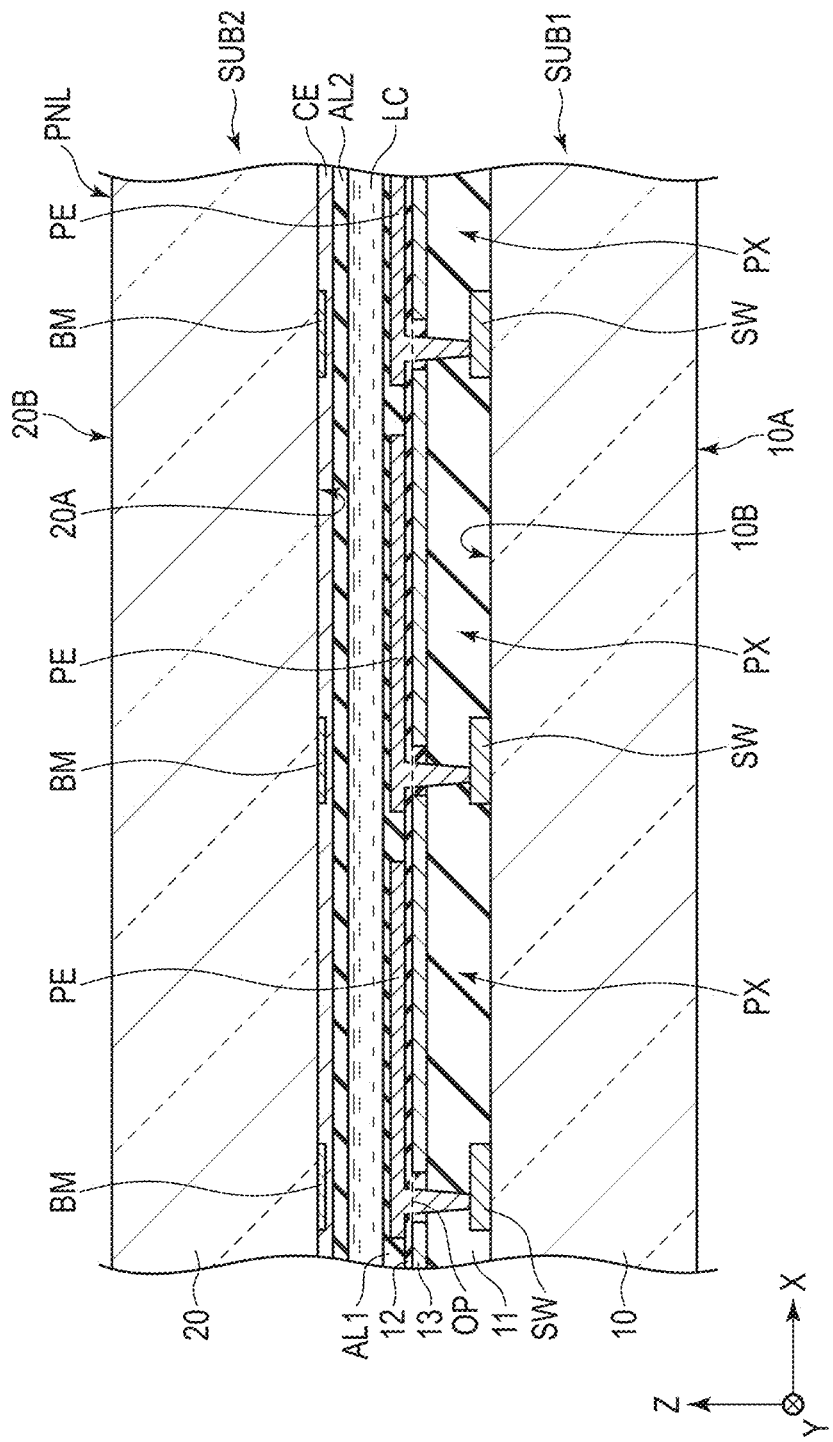
FIG. 2 is a cross-sectional view showing a configuration example of a display panel shown in FIG. 1.

FIG. 2 is a cross-sectional view illustrating a configuration example of the display panel PNL shown in FIG. 1.

The first substrate SUB1 comprises a transparent substrate (first transparent substrate) 10, insulating films 11 and 12, capacitive electrodes 13, switching elements SW, pixel electrodes PE and an alignment film AL1. The first substrate SUB1 further comprises scanning lines G and signal lines S shown in FIG. 1. The transparent substrate 10 comprises a main surface (lower surface) 10A and a main surface (upper surface) 10B on an opposite side to the main surface 10A. The switching elements SW are disposed on the main surface 10B. The insulating film 11 covers the switching elements SW. The capacitive electrodes 13 are located between the insulating films 11 and 12.

The pixel electrodes PE are disposed respectively for the pixels PX on the insulating film 12. Each pixel electrode PE is electrically connected to the respective switching element SW via an opening OP of the respective capacitive electrode 13. The pixel electrode PE overlaps the respective capacitive electrode 13 while interposing the insulating film 12 therebetween to form a capacitor CS of the pixel PX. The alignment film AL1 covers the pixel electrodes PE.

The second substrate SUB2 comprises a transparent substrate (second transparent substrate) 20, light-shielding layers BM, a common electrode CE and an alignment film AL2. The transparent substrate 20 includes a main surface (lower surface) 20A and a main surface (upper surface) 20B on an opposite side to the main surface 20A. The main surface 20A of the transparent substrate 20 and the main surface 10B of the transparent substrate 10 oppose each other. The light-shielding layers BM and the common electrode CE are disposed on the main surface 20A. The light-shielding layers BM are located, for example, directly above the respective switching elements SW and directly above the respective scanning lines G and the respective signal lines S, which are not shown in the figure. The common electrode CE is disposed over the plurality of pixels PX and directly covers the light-shielding layers BM. The common electrode CE is electrically connected to the capacitive electrodes 13 and is at the same potential as that of the capacitive electrodes 13. The alignment film AL2 covers the common electrode CE. The liquid crystal layer LC is located between the main surface 10B and the main surface 20A and is in contact with the alignment films AL1 and AL2. In the first substrate SUB1, the insulating films 11 and 12, the capacitive electrodes 13, the switching elements SW, the pixel electrodes PE, and the alignment film AL1 are located between the main surface 10B and the liquid crystal layer LC. In the second substrate SUB2, the light-shielding layers BM, the common electrodes CE, and the alignment film AL2 are located between the main surface 20A and the liquid crystal layer LC.

The transparent substrates 10 and 20 are each an insulating substrate such as of glass or plastic. The main surfaces 10A and 10B and the main surfaces 20A and 20B are approximately parallel to the X-Y plane. The insulating film 11 is formed of a transparent insulating material such as silicon oxide, silicon nitride, silicon oxynitride, acrylic resin or the like. For example, the insulating film 11 includes inorganic and organic insulating films. The insulating film 12 is an inorganic insulating film such as silicon nitride. The capacitive electrodes 13, the pixel electrodes PE, and the common electrode CE are transparent electrodes formed of a transparent conductive material such as indium tin oxide (ITO) or indium zinc oxide (IZO). The light-shielding layers BM are each, for example, a conductive layer having a resistance lower than the common electrode CE. For example, the light-shielding layers BM are formed of an opaque metal material such as molybdenum, aluminum, tungsten, titanium or silver. The alignment films AL1 and AL2 are horizontal alignment films having an alignment restriction force that is substantially parallel to the X-Y plane. For example, the alignment films AL1 and AL2 are subjected to alignment treatment along the first direction X. The alignment treatment may be a rubbing treatment or a photo-alignment treatment.

Figure 3:
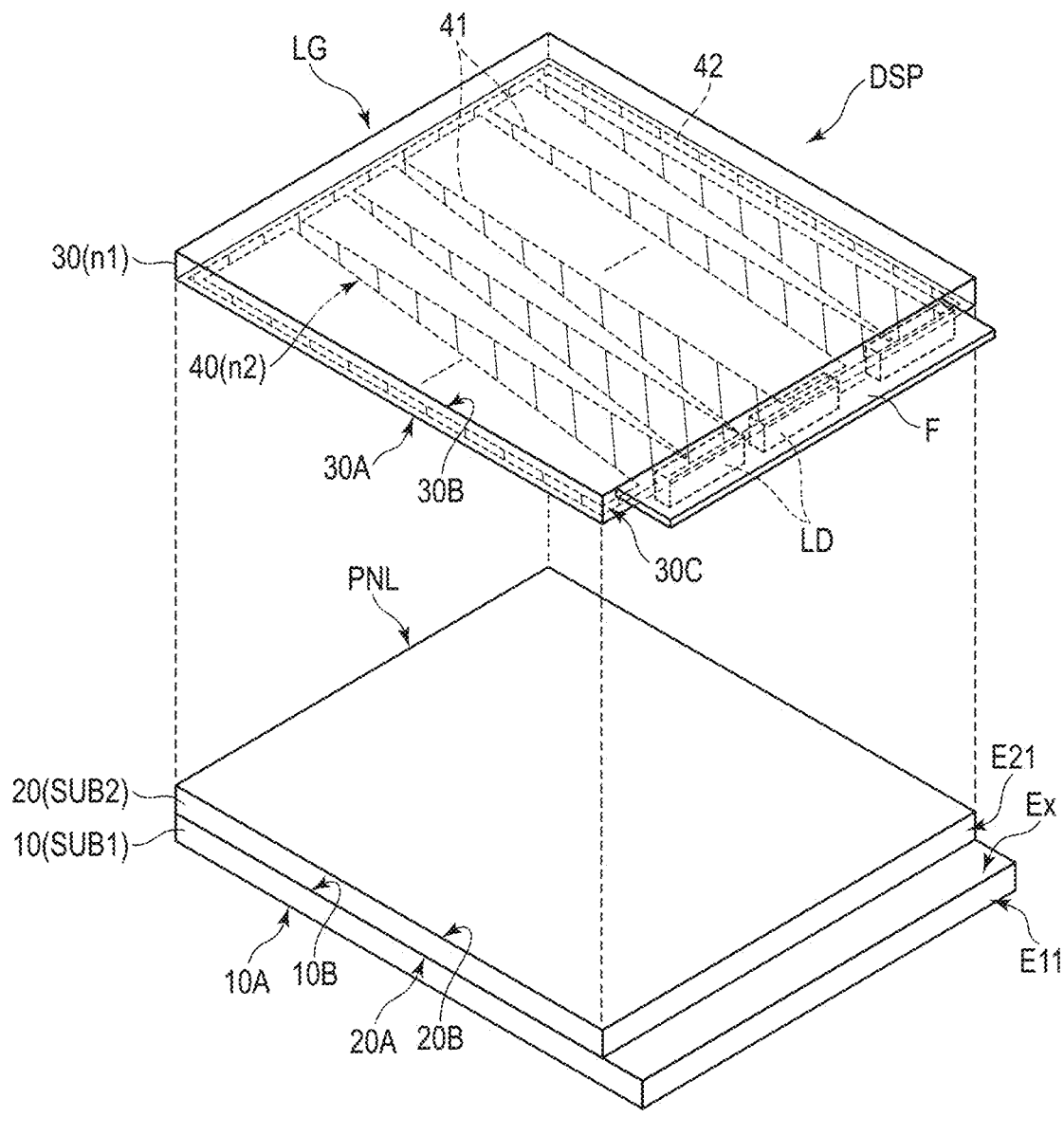
FIG. 3 is an exploded schematic view of a main part of the display device shown in FIG. 1.

FIG. 3 is an exploded schematic view illustrating the main part of the display device DSP shown in FIG. 1.

The display device DSP comprises a light guide element LG and a plurality of light emitting elements LD, in addition to the display panel PNL. The first substrate SUB1, the second substrate SUB2 and the light guide elements LG are arranged along the third direction Z in this order. The plurality of light emitting elements LD are arranged to be spaced apart from each other along the first direction X. The plurality of light emitting elements LD are connected to the wiring board F. The light emitting elements LD are, for example, light emitting diodes. The light emitting elements LD each comprise a red light emitting portion, a green light emitting portion and a blue light emitting portion, though they will not be described in detail. Light emitted from each light emitting element LD travels along the direction of the arrow indicating the second direction Y.

The light guide element LG comprises a transparent substrate (third transparent substrate) 30 and a transparent layer 40.

The transparent substrate 30 is an insulating substrate such as of glass or plastic and has a refractive index n1. For example, the transparent substrate 30 is not formed from a plurality of substrates bonded together, but a single substrate. The transparent substrate 30 includes a main surface (lower surface) 30A, a main surface (upper surface) 30B on an opposite side to the main surface 30A and a side surface 30C. The main surfaces 30A and 30B are substantially parallel to the X-Y plane. The main surface 30A opposes the main surface 20B of the transparent substrate 20. The side surface 30C is approximately parallel to the X-Z plane defined by the first direction X and the third direction Z. The side surface 30C opposes a plurality of light emitting elements LD. The transparent substrate 30 is adhered to the transparent substrate 20 while interposing the transparent layer 40 therebetween, as will be described later. In the example shown in FIG. 3, the side surface 30C is located directly above the edge portion E21 of the second substrate SUB2, but it may be located directly above the extending portion Ex or further out than the edge portion E11.

The transparent layer 40 is disposed on the main surface 30A. The transparent layer 40 has a refractive index n2, which is lower than the refractive index n1 of the transparent substrate 30. The transparent layer 40 comprises a plurality of strip portions 41 arranged to be spaced apart from each other along the first direction X. Each of the strip portions 41 extends along the second direction Y. Between each adjacent pair of strip portions 41, the main surface 30A is exposed. The transparent layer 40 comprises a frame portion 42 which surrounds the plurality of strip portions 41. The shape of the transparent layer 40 will be described in detail later.

The transparent substrate 30 is formed, for example, of glass or an organic material such as polymethyl methacrylate (PMMA) or polycarbonate (PC). The transparent layer 40 is formed of an organic material such as, for example, siloxane-based resin or fluorinated resin. Further, the refractive index n1 of the transparent substrate 30 is about 1.5, and the refractive index n2 of the transparent layer 40 is about 1.0 to 1.4.

Figure 4:
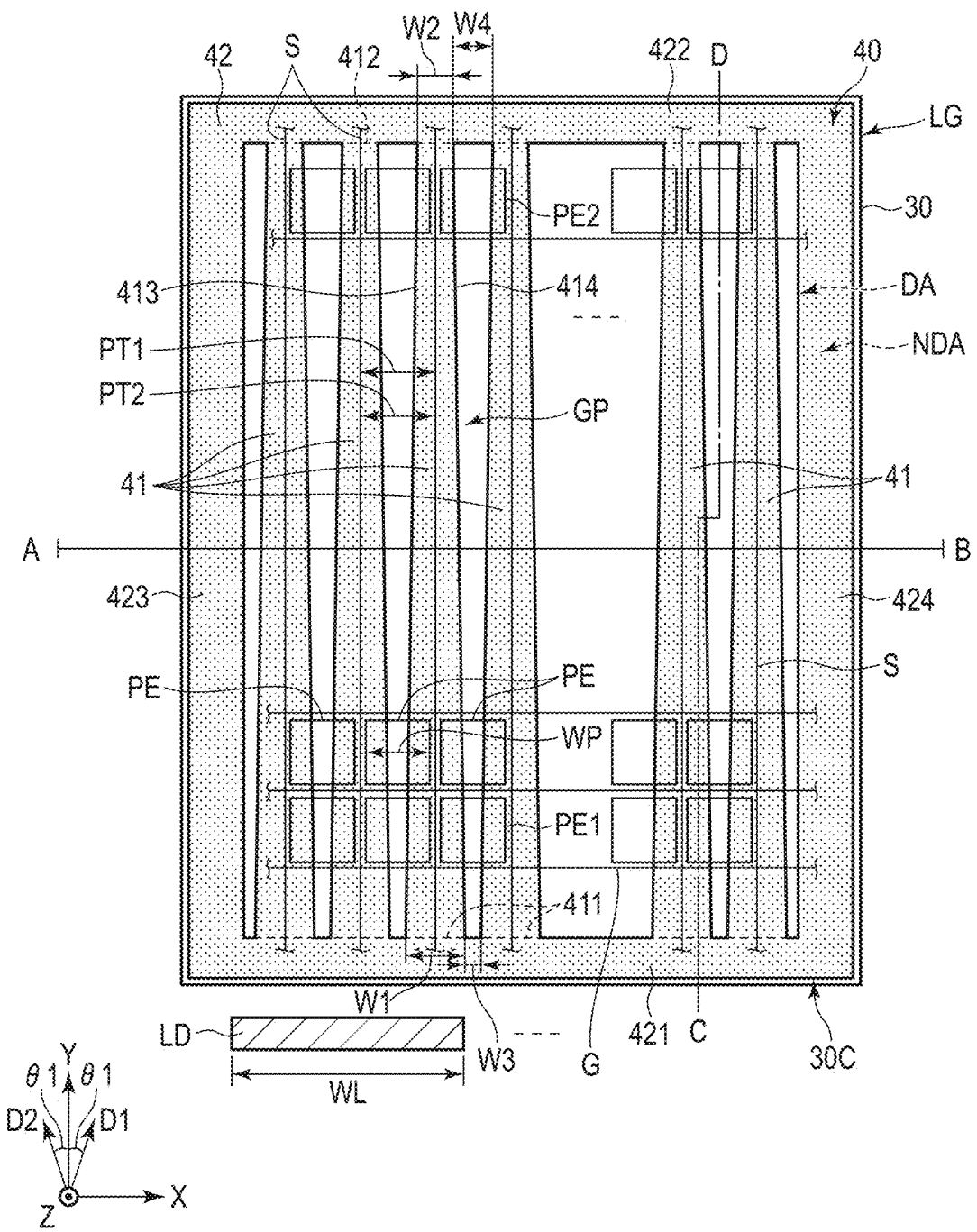
FIG. 4 is a plan view showing a configuration example of a light guide element shown in FIG. 3.

FIG. 4 is a plan view of a configuration example of the light guide element LG shown in FIG. 3.

As described above, the transparent layer 40 has a plurality of strip portions 41 and a frame portion 42 which surrounds the plurality of strip portions 41. The strip portions 41 and the frame portion 42 are formed to be integrated as one body.

The strip portions 41 each include a first end portion 411 on a side opposing the light emitting element LD, a second end portion 412 on an opposite side to the first end portion 411, a first edge 413 and a second edge 414. The first end portion 411 and the second end portion 412 have a first width W1 and a second width W2, respectively. Note that the term "width" used in the descriptions corresponds to a length along the first direction X. The first width W1 is greater than the second width W2. For example, the first width W1 is less than the width WL of one light emitting element LD, and the one light emitting element LD is arranged across over a plurality of strip portions 41 and a plurality of signal lines S aligned along the first direction X. The first width W1 shown in FIG. 4 is equal to or less than the width WP of one pixel electrode PE (or the pitch of the pixel electrodes PE aligned along the first direction X). Note that in the strip portions 41, the first width W1 may be equivalent to the second width W2, or the strip portions 41 may be formed to have a constant width.

The first edge 413 and the second edge 414 extend in a direction different from the first direction X and the second direction Y between the first end portion 411 and the second end portion 412. Here, let us define, for example, a direction intersecting at an acute angle clockwise to the second direction Y as a direction D1, and a direction intersecting at an acute angle counterclockwise to the second direction Y as a direction D2. Note that the angle θ1 made between the second direction Y and the direction D1, and the angle θ1 made between the second direction Y and the direction D2 are equal to each other, but the configuration is not limited to this. The angle made by the second direction Y and the direction D1 and the angle made between the second direction Y and the direction D2 may be different from each other. The first edge 413 extends along the direction D1 and the second edge 414 extends along the direction D2. Here, both the first edge 413 and the second edge 414 extend in a straight line, but may be formed into a curved line. The first width W1 and the second width W2 correspond to the distance between the first edge 413 and the second edge 414. The strip portions 41 of such a shape each have a width that gradually decreases at a constant rate or at an arbitrary rate as the location is closer to the second edge 412 from the first edge 411.

Focusing on two adjacent strip sections 41, the gap at the first end portion 411 and the gap at the second end portion 412 have a third width W3 and a fourth width W4, respectively. The third width W3 is less than the first width W1, the fourth width W4 is less than the second width W2, and the third width W3 is less than the fourth width W4. For example, the second width W2 is about ⅔ of the first width W1, the first width W1 is about 9 times the third width W3, the second width W2 is about 1.5 times the fourth width W4, and the fourth width W4 is about 4 times the third width W3. The pitch PT1 of adjacent strip portions 41 should desirably be twice or less the width WP of the pixel electrodes PE (or the pitch of the pixel electrodes PE aligned along the first direction X).

The pixel electrodes PE each overlap a respective adjacent pair of strip portions 41 in plan view. The pixel electrodes PE each overlaps the gap GP as well between the respective adjacent pair of strip sections 41. In the display area DA, let us focus on a pixel electrode PE1, which is closest to the light emitting element LD and a pixel electrode PE2, which is farthest away from the light emitting element LD. The area where the pixel electrode PE1 overlaps the respective strip portions 41 is greater than the area where the pixel electrode PE2 overlap the respective strip portions 41. Further, the area where the pixel electrode PE1 overlap the respective gap GP is less than the area where the pixel electrode PE2 overlaps the gap GP. As will be described later, the regions overlapping the strip portions 41 correspond to regions where light from the light emitting elements LD does not substantially enters, while the regions overlapping the gaps GP correspond to regions where light from the light emitting elements LD can enter.

When the display panel PNL and the light guide elements LG shown in FIG. 3 overlap each other, the plurality of strip portions 41 overlap the display area DA, and the frame section 42 overlaps the non-display area NDA, in plan view. The outline of the frame portion 42 is located on an inner of the outline of the transparent substrate 30. The inner side of the frame section 42 corresponds to the display area DA. The frame portion 42 includes a first portion 421 and a second portion 422 extending along the first direction X, and a third portion 423 and a fourth portion 424 extending along the second direction Y. The first portion 421 is located between the light emitting elements LD and the display area DA. The first portion 421 is connected to the first end portion 411 of each of the strip portions 41. In the example shown in FIG. 4, the second portion 422 is connected to the second end portion 412 of each of the strip portions 41, but may be spaced apart from the second end portions 412. The strip portions 41 do not include edges parallel to the first direction X in the display area DA, and only the first edge 413 and the second edge 414 inclined with respect to the first direction X and the second direction Y overlap the display area DA.

A plurality of signal lines (first wiring lines) S are aligned along the first direction X and extend in the second direction Y. A plurality of scanning lines (second wiring lines) G are aligned along the second direction Y and extend in the first direction X. The plurality of scanning lines G intersect the plurality of signal lines S. The plurality of signal lines S overlap the plurality of strip portions 41, respectively and extend in the same direction. In this embodiment, if a wiring line that extends in the same direction as that of the strip portion 41 is defined as the first wiring line, then in the example shown in FIG. 4, the first wiring lines are the signal lines S. The number of signal lines S is equal to the number of strip portions 41. The signal lines S are each located at a center of the first width W1 of the respective strip portion 41 at the position overlapping the first end portion 411 and at the center of the second width W2 of the respective strip portion 41 at the position overlapping the second end portion 412. Further, the signal lines S are aligned in the first direction X at a pitch PT2. The pitch PT2 of the signal lines S is equal to the pitch PT1 of the strip portions 41.

In the example shown in FIG. 4, the strip portions 41 extend in the same direction as that of the signal lines S. But, as described later, the strip portions 41 may extend in the same direction as that of the scanning lines G. In the example illustrated, the number of signal lines S and the number of strip portions 41 are equal to each other, but as described later, the number of signal lines S may be an integral multiple of two or more times the number of strip portions 41.

Figure 5:
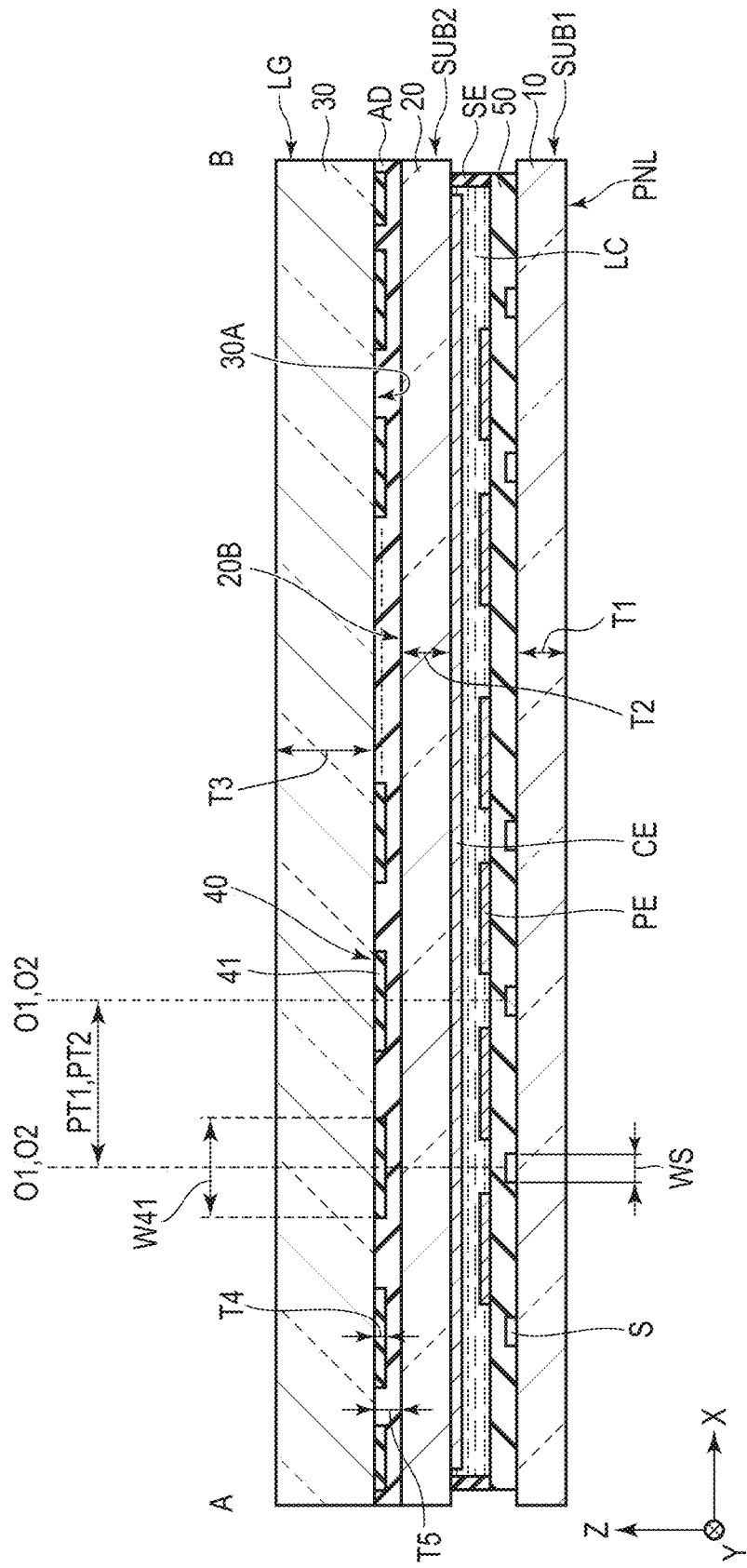
FIG. 5 is a cross-sectional view schematically showing a part of the display device taken along line A-B shown in FIG. 4.

FIG. 5 is a schematic cross-sectional view of a part of the display device DSP taken along line A-B shown in FIG. 4. Note that, for the display panel PNL, only the main part is illustrated. The layers including the switching element SW, the insulating films 11 and 12, the capacitive electrode 13 and the like described above are collectively referred to as a configuration layer 50.

The configuration example shown in FIG. 5 corresponds to an example in which the transparent substrate 30 of the light guide element LG is bonded to the transparent substrate 20 of the second substrate SUB2 by the transparent adhesive layer AD. The transparent layer 40 including the strip portions 41 is in contact with the main surface 30A. The transparent adhesive layer AD is brought into contact with substantially the entire main surface 20B and also covers the transparent layer 40, and in the region where the transparent layer 40 is missing, it is brought into contact with the main surface 30A.

The refractive index of each of the transparent substrates 10 and 20 with respect to the transparent adhesive layer AD is equivalent to the refractive index n1 of the transparent substrate 30 and higher than the refractive index n2 of the transparent layer 40. Note that the expression "equivalent" used here is not limited to the case where the difference in refractive index is zero, but includes the case where the difference in refractive index is 0.03 or less.

The transparent substrate 10 has a thickness T1, the transparent substrate 20 has a thickness T2, and the transparent substrate 30 has a thickness T3. The term "thickness" used in this description corresponds to the length along the third direction Z. In the example illustrated, the thickness T1 is equivalent to the thickness T2, and the thickness T3 is greater than thickness T1 or T2. Note that the thickness T3 may be equivalent to the thicknesses T1 and T2. For example, the thickness T3 is 200 μm to 2000 μm. The thickness T4 of the transparent layer 40 should desirably be 250 nm or more and 800 nm or less, and, more desirably, 400 nm or more and 550 nm or less. The thickness T5 of the transparent adhesive layer AD is 4 μm or more to 4,000 μm or less.

Let us define the width at each location of each strip portion 41 along the first direction X as a width W41, and the central position of the width W41 as a center O1. Similarly, let us define the width at each location of each signal line S as a width WS, and the central location of the width WS as a center O2. The center O1 of the width W41 of the strip portion 41 overlaps the center O2 of the width WS of the respective signal line S. The pitch PT1 of the strip portions 41 is defined by the distance between the centers O1 of each adjacent pair of strip portions 41. The pitch PT2 of the signal line S is defined by the distance between the centers O2 of each adjacent pair of signal lines S.

Next, the light emitted from the light emitting elements LD will be explained with reference to FIG. 6.

FIG. 6 is a cross-sectional view schematically showing a part of the display device DSP taken along like C-D shown in FIG. 4.

The light emitting elements LD emit light L1 toward the side surface 30C. Here, an air layer is present between the light emitting elements LD and the side surface 30C, the light L1 emitted from the light emitting elements LD is refracted at the side surface 30C and enters the transparent substrate 30. Of the light L1 having entered the transparent substrate 30, light traveling from the transparent substrate 30 toward the transparent layer 40 is reflected at the interface between the transparent substrate 30 and the transparent layer 40. Of the light L1 having entered the transparent substrate 30, light traveling toward the main surface 30B is reflected at the interface between the transparent substrate 30 and the air layer. Thus, in the vicinity of the side surface 30C (or the area where the transparent layer 40 exists), the light L1 travels inside the transparent substrate 30 while being repeatedly reflected. Of the light L1 traveling, light traveling toward the area where the transparent layer 40 does not exist, that is, the area where the transparent substrate 30 and the transparent adhesive layer AD are in contact with each other, is transmitted through the transparent substrate 30 and further through the transparent substrate 20 via the transparent adhesive layer AD. In other words, in the area close to the light emitting elements LD, the incidence of the light L1 from the light emitting elements LD to the display panel PNL is suppressed, whereas in the area remote from the light emitting elements LD, the incidence of the light L1 to the display panel PNL is promoted. Note that in the area close to the light emitting elements LD, the light L1 is not perfectly prevented from entering the display panel PNL, but light L1 enters the display panel PNL through the gaps between adjacent pairs of strip portions 41, as shown in FIG. 4. The light L1 having entered the display panel PNL passes through the pixels in the transparent state and is scattered by the pixels in the scattered state. The display device DSP can be observed from a main surface 30B side as well as from a main surface 30A side. Further, the display device DSP is a so-called transparent display, and the background of the display device DSP can be observed through the display device DSP even when it is observed from the main surface 30B side or the main surface 30A side.

Incidentally, generally, the emitted light from a plurality of light emitting elements LDs arranged at intervals proceeds while diffusing, but in the vicinity of the light emitting elements LDs, the respective emitted light from adjacent pairs of light emitting elements LDs may not mix sufficiently. Consequently, in a display device DSP using such light as illumination light, there is a risk that non-uniformity in a strip-like shape may be visually recognizable due to a difference in luminance in the area near the light emitting elements DL when the display area DA is viewed in plan view. The luminance difference of illumination light is reduced further at a location further distant from the light emitting element LD. However, increasing the distance between the display area DA and the light emitting element LD leads to an increase in the frame width of the display device DSP.

According to this embodiment, in the area where the transparent layer 40 is present, the light L1 entering from the side surface 30C is guided while being totally reflected inside the transparent substrate 30, and therefore the light incident on the display panel PNL is suppressed. On the other hand, in the area where the transparent layer 40 is not present, the incidence of the light L1 into the display panel PNL is promoted.

In the display area DA, the amount of illumination of light L1 incident on the pixel electrode PE1, which is close to the light emitting element LD, and that of the pixel electrode PE2, which is remote from the light emitting elements LD are compared with each other. The light L1 from the light emitting elements LD attenuates as the location is further distant from the light emitting elements LD. Here, the luminance of the light L1 in the area close to the light emitting elements LD is referred to a first luminance, and the luminance of the light L1 in the area distant away from the light emitting elements LD is referred to as a second luminance. The second luminance is lower than the first luminance. The overlapping area between the pixel electrode PE1 and the transparent layer 40 is larger than the overlapping area between the pixel electrode PE2 and the transparent layer 40. Therefore, the area of the region where the light L1 can enter the pixel electrode PE1 is smaller than the area of the region where the light L1 can enter the pixel electrode PE2. On the other hand, the first luminance of the light L1 incident on the pixel electrode PE1 is higher than the second luminance of the light L1 incident on the pixel electrode PE2. With this configuration, the amount of illumination light at the pixel electrode PE1 and that of the pixel electrode PE2 can be equalized with each other.

Further, in the display area DA, the overlapping area between each of the pixel electrodes PE aligned along the second direction Y and the transparent layer 40 is optimized to follow up the decrease in the luminance of the light L1, which occurs along the second direction Y. Thus, the amount of illumination light per pixel electrode PE can be made uniform over substantially the entire display area DA. As a result, the deterioration of display quality caused by non-uniformity in illumination light can be suppressed.

Further, according to this embodiment, the strip portions 41 is arranged to overlap the first wiring lines (signal lines S), respectively. That is, the strip portions 41 can serve to suppress the light L1 from reaching the first wiring lines. With this configuration, the absorption of the light L1 by the first wiring lines can be suppressed and the luminance of the display panel PNL can be improved. In the example illustrated, the strip portions 41 extend in the same direction as that of the signal line S and thus cover the signal lines S. But, when the strip portions 41 extend in the same direction as that of the scanning line G, they cover the scanning lines G. In that case, the strip portions 41 suppresses the light L1 from reaching the scanning lines G.

Note that in the example shown in FIG. 6, the main surface 30B of the transparent substrate 30 is in contact with air, but another transparent layer having a refractive index equivalent to that of the transparent layer 40 may be placed on the entire surface of the main surface 30B. The main surface 10A of the transparent substrate 10 is in contact with air, but another transparent substrate similar to the transparent substrate 30 may be bonded to the main surface 10A.

Figure 7:
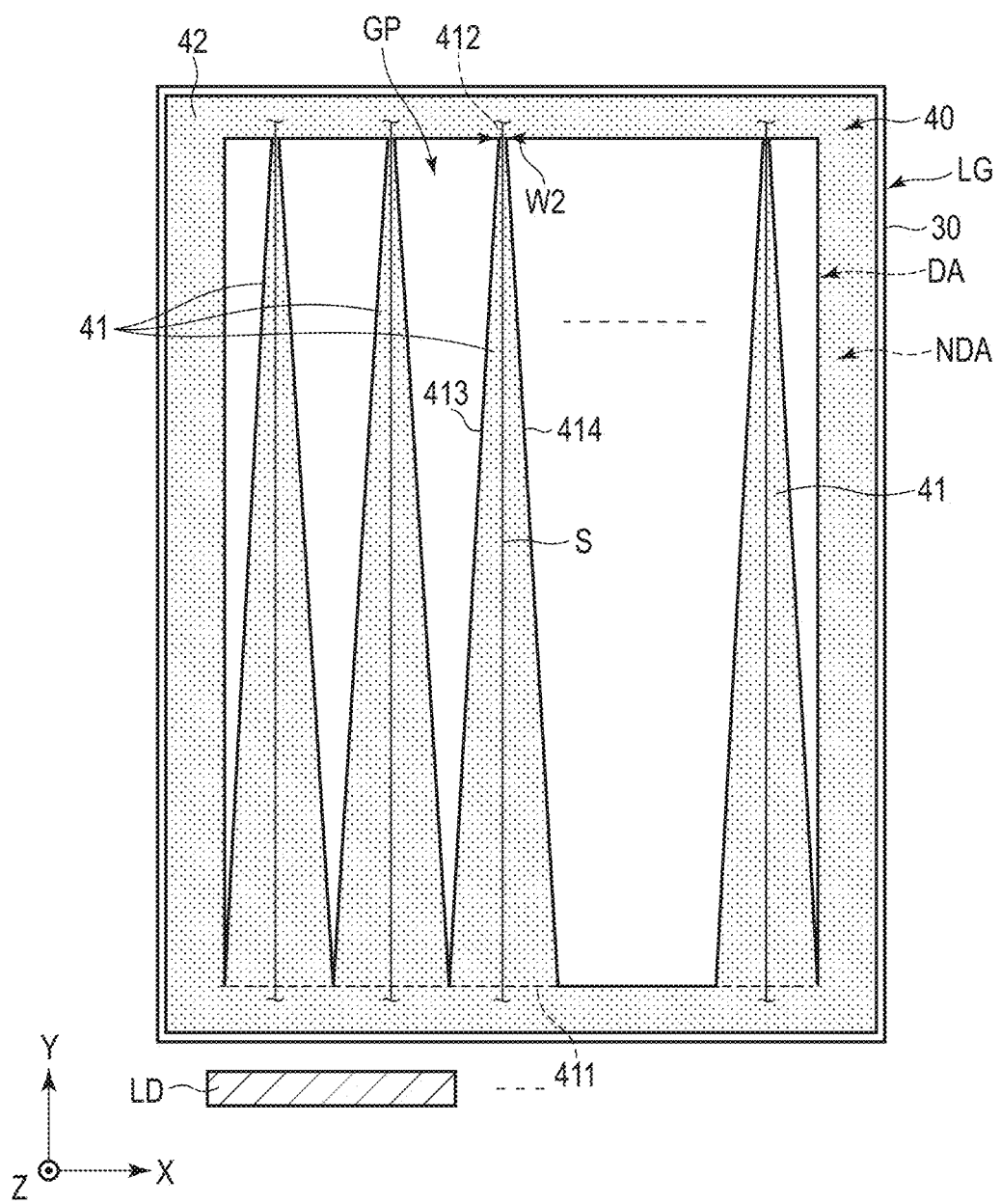
FIG. 7 is a plan view of another configuration example of the light guide element shown in FIG. 4.

FIG. 7 is a plan view of another configuration example of the light guide element LG shown in FIG. 4. The configuration example shown in FIG. 7 differs from that of FIG. 4 in that the strip portions 41 are formed in a triangular shape.

The strip portions 41 each have a triangular shape comprising three sides of the first end portion 411, the first edge 413 and the second edge 414. Therefore, the second width W2 shown in FIG. 7 is formed smaller than the second width W2 shown in FIG. 4. Thus, the area of the gap GP can be expanded. Note that the second width W2 is greater than the width of the signal line S.

In this configuration example, advantageous effects similar to those of the configuration example shown in FIG. 4 can be obtained.

Figure 8:
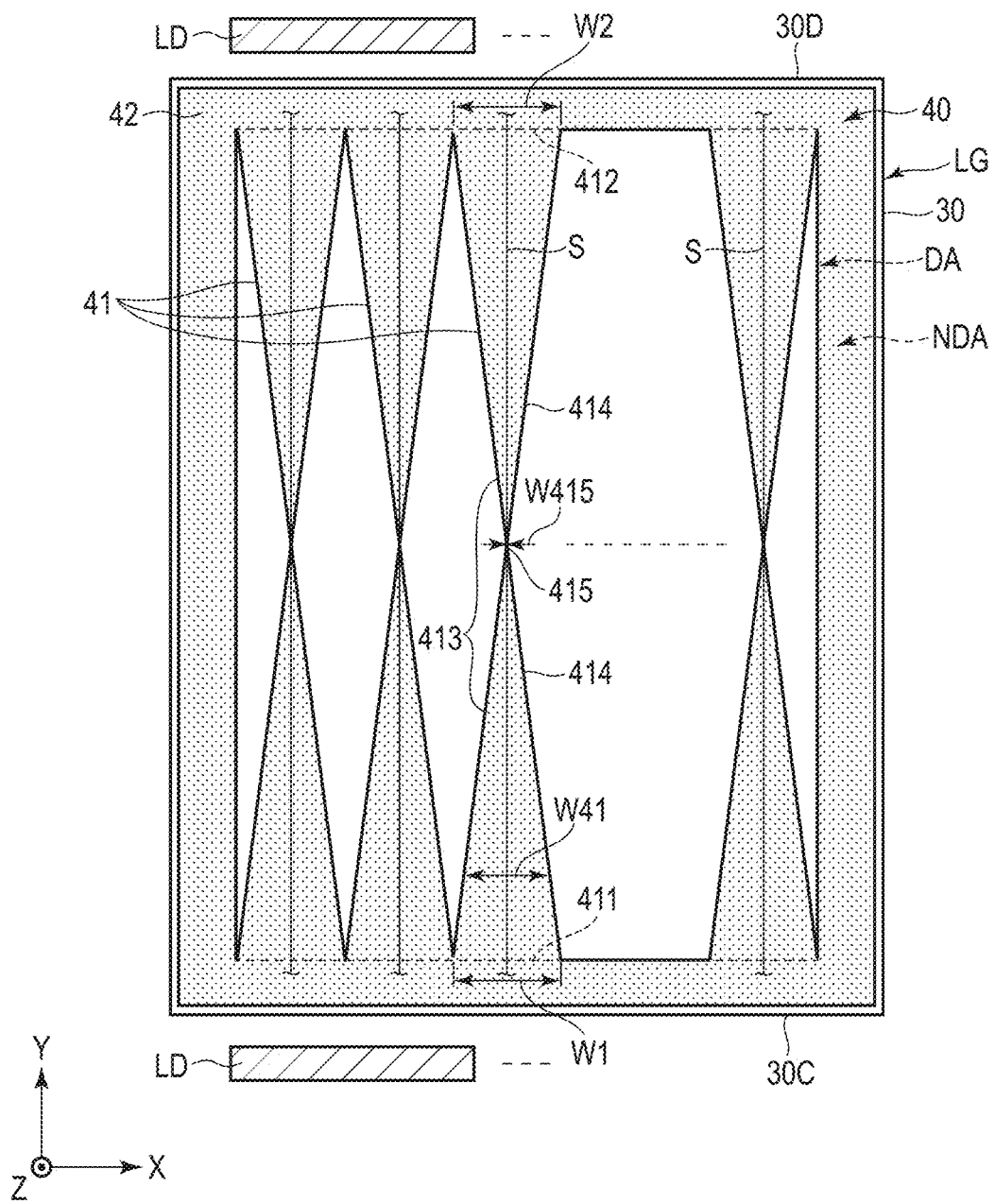
FIG. 8 is a plan view of another configuration example of the light guide element shown in FIG. 4.

FIG. 8 is a plan view of another configuration example of the light guide element LG shown in FIG. 4. The configuration example shown in FIG. 8 differs from that of FIG. 4 in that the width W41 of the strip portions 41 is reduced at the middle portion 415 between the first end portion 411 and the second end portion 412.

The first width W1 of the first end portion 411 is greater than the width W415 of the middle portion 415, and the second width W2 of the second end portion 412 is greater than the width W415 of the middle portion 415. The width W41 of the strip portions 41 decreases from the first end portion 411 towards the middle portion 415. Further, the width W41 of the strip portions 41 decreases from the second end portion 412 towards the middle portion 415. The transparent substrate 30 comprises a side surface 30D on an opposite side to the side surface 30C, and light emitting elements LD are disposed on a location opposing the side surface 30D as well. By reducing the width W41 of the strip portions 41 in the middle portion 415, more light can be made to reach the center of the display panel when light enters from both side surfaces of the light guide element LG. With this configuration, the decrease in luminance in the center of the display panel can be suppressed. Note that the width W415 is greater than the width of the signal lines S.

In this configuration example as well, advantageous effects similar to those of the configuration example shown in FIG. 4 can be obtained.

Figure 9:
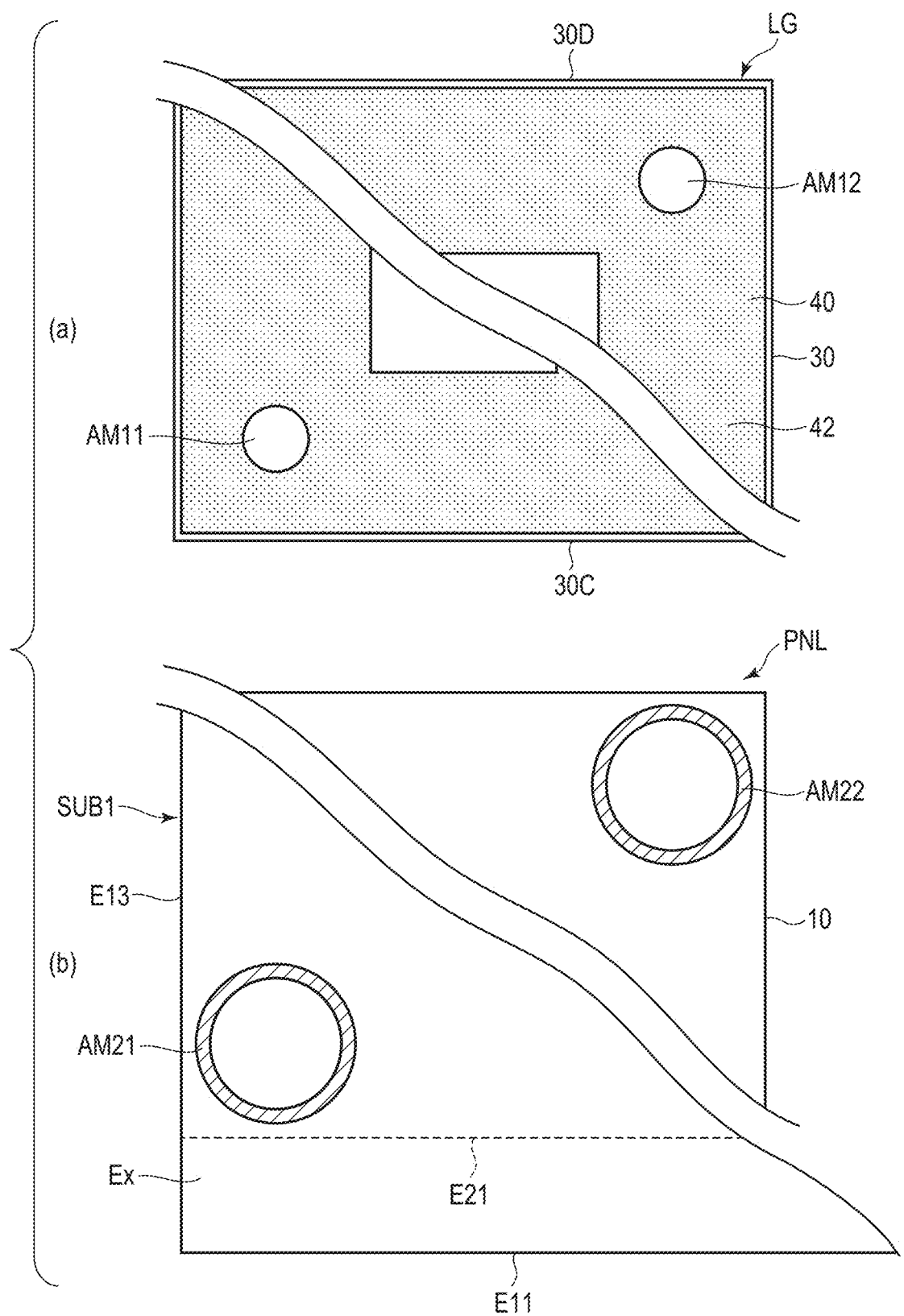
FIG. 9 is a plan view showing alignment marks.

FIG. 9 is a plan view showing alignment marks.

FIG. 9 shows in part (a), diagonal corners of the light guide element LG. The light guide element LG includes alignment marks AM11 and AM12 located on the diagonal line. The alignment marks AM11 and AM12 are formed on the frame 42 of the transparent layer 40. For example, the alignment marks AM11 and AM12 are formed by punching out the transparent layer 40. The alignment marks AM11 and AM12 are each formed into a circular shape.

FIG. 9 shows in part (b), diagonal corners of the display panel PNL. The first substrate SUB1 includes alignment marks AM21 and AM22 located on the diagonal line. The alignment marks AM21 and AM22 are formed from a metal material. The alignment marks AM21 and AM22 are, for example, formed on the same layer and made of the same material as those of the signal lines S. The alignment mark AM21 is located near the intersection of the edge portion E21 and the edge portion E13. Further, the alignment marks AM21 and AM22 are formed into an annular shape.

Figure 10:
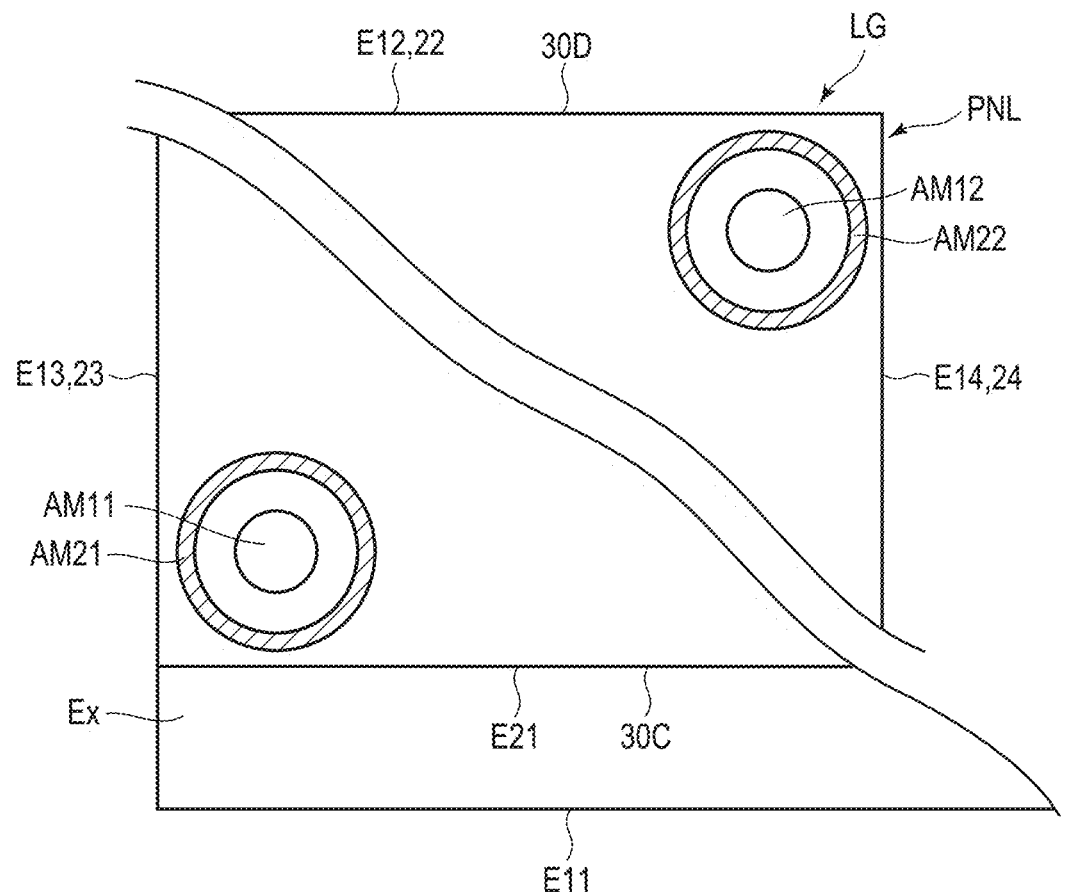
FIG. 10 is a plan view showing a state where the light guide element of FIG. 9, part (a) and the display panel of FIG. 9, part (b) stacked one on another.

FIG. 10 is a plan view showing a state in which the light guide element LG of FIG. 9, part (a) and the display panel PNL of FIG. 9, part (b) bonded together.

The apparatus of manufacturing the display device recognizes positions of the alignment marks AM11 and AM12 on the light guide element LG and the alignment marks AM21 and AM22 on the display panel PNL and aligns the light guide element LG and the display panel PNL with respect to each other. In the state where the light guide element LG is attached to the display panel PNL, the alignment mark AM11 is located on the inner circumferential side of the alignment mark AM21, and the alignment mark AM12 is located on the inner circumferential side of the alignment mark AM22. Thus, by aligning the light guide element LG and the display panel PNL with each other using the alignment marks, the signal lines each can be aligned with the center of the width of the respective strip portion.

Note that the positions and shapes of the alignment marks AM11, AM12, AM21 and AM22 are not limited to those of the example illustrated.

FIG. 11 is an exploded schematic view of another configuration example of the display device DSP shown in FIG. 3. The configuration example shown in FIG. 11 differs from that of FIG. 3 in that the light guide elements LG are located below the display panel PNL.

The light guide element LG, the first substrate SUB1 and the second substrate SUB2 are aligned along the third direction Z in this order.

The main surface 30B of the transparent substrate 30 opposes the main surface 10A of the transparent substrate 10. As will be described later, the transparent substrate 30 is bonded to the transparent substrate 10 while interposing the transparent layer 40 therebetween. In the example shown in FIG. 11, the side surface 30C is located directly below the edge portion E11 of the first substrate SUB1, but it may be located directly below the extending portion Ex or further out than the edge portion E11.

The transparent layer 40 is disposed on the main surface 30B. As in the case of FIG. 3, the transparent layer 40 comprises a plurality of strip portions 41 arranged to be spaced apart from each other along the first direction X. Each of the strip portions 41 extends along the second direction Y. Between each adjacent pair of strip portions 41, the main surface 30B is exposed. Further, the transparent layer 40 comprises a frame portion 42 that surrounds the plurality of strip portions 41.

Note that in the example shown in FIG. 11, the main surface 30A of the transparent substrate 30 is in contact with air, but another transparent layer having a refractive index equivalent to that of the transparent layer 40 may be disposed on the entire main surface 30A. Further, the main surface 20B of the transparent substrate 20 is in contact with air, but another transparent substrate similar to the transparent substrate 30 may be bonded to the main surface 20B.

Figure 12:
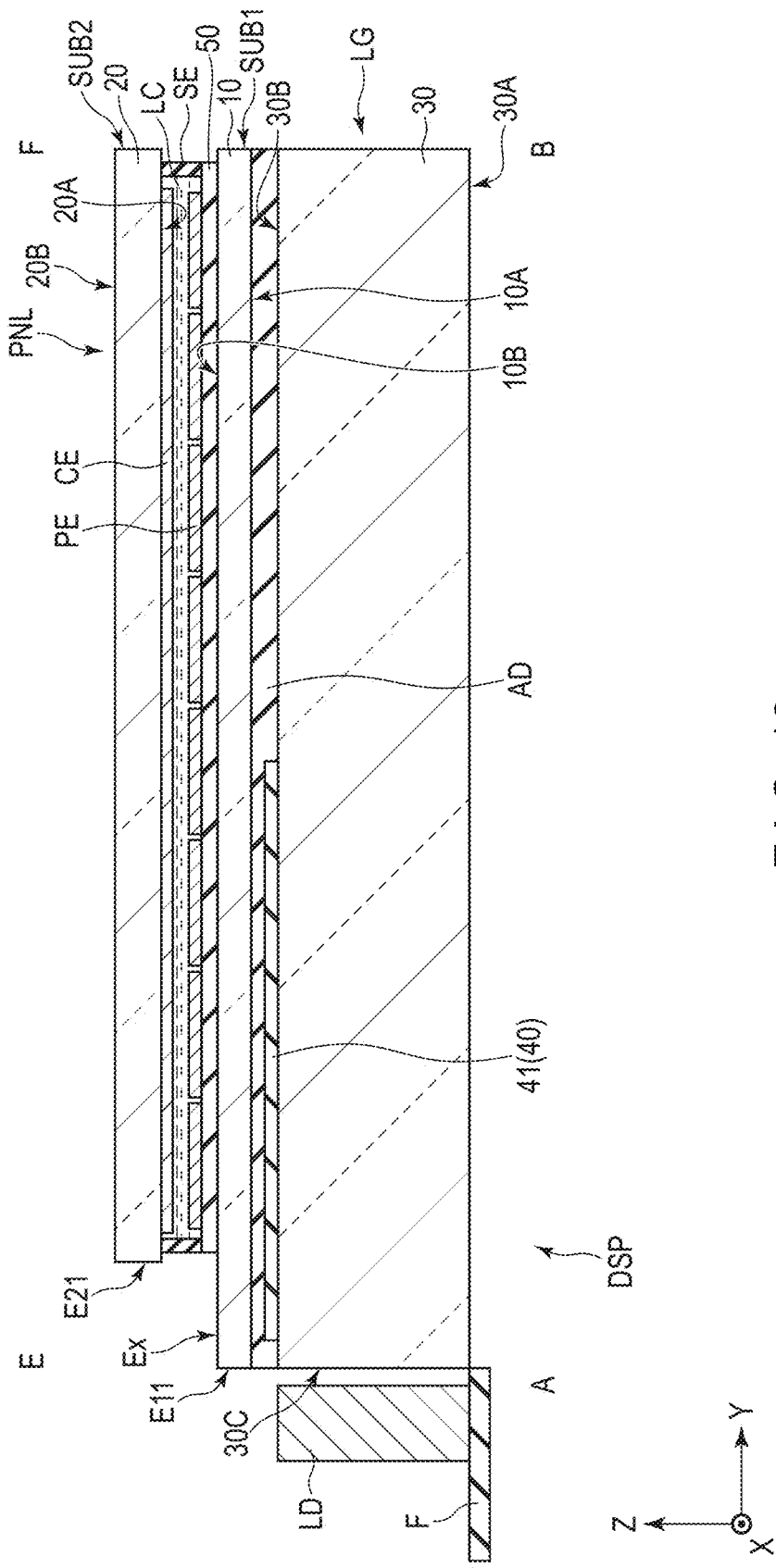
FIG. 12 is a cross-sectional view schematically showing a part of the display device taken along line E-F shown in FIG. 11.

FIG. 12 is a cross-sectional view schematically showing a part of the display device DSP taken along line E-F shown in FIG. 11. Note that for the display panel PNL, only the main part is shown.

The configuration example shown in FIG. 12 corresponds to an example in which the transparent substrate 30 of the light guide element LG is bonded to the transparent substrate 10 of the first substrate SUB1 by the transparent adhesive layer AD. The transparent layer 40 including the strip portions 41 is in contact with the main surface 30B. The transparent adhesive layer AD is brought into contact with substantially the entire main surface 10A and further covers the transparent layer 40, and in the area where the transparent layer 40 is missing, it is brought into contact with the main surface 30B. As to the configuration of the display panel PNL, please refer to the description provided before.

In this configuration example, advantageous effects similar to those of the configuration example shown in FIG. 5 can be obtained.

FIG. 13 is a plan view of another configuration example of the light guide element LG shown in FIG. 4. The configuration example shown in FIG. 13 differs from that of FIG. 4 in that the strip portions 41 extend in the same direction as that of the scanning lines G.

The plurality of scanning lines (first wiring lines) G are aligned along the first direction X and extend in the second direction Y. The plurality of signal lines (second wiring lines) S are aligned along the second direction Y and extend in the first direction X. The plurality of signal lines S intersect the plurality of scanning lines G. The plurality of scanning lines G overlap the plurality of strip portions 41, respectively and extend in the same direction. In this embodiment, if the wiring lines extending in the same direction as that of the strip portions 41 are referred to as the first wiring lines, then in the example shown in FIG. 13, the first wiring lines are the scanning lines G. The number of scanning lines G is equal to the number of strip portions 41. The scanning lines G are each located at the center of the first width W1 of the respective strip portions 41 at the position overlapping the first end portion 411 and at the center of the second width W2 of the respective strip portion 41 at the position overlapping the second end portion 412. The strip portions 41 are aligned along the first direction X at a pitch PT1. The scanning lines G are aligned along the first direction X at a pitch PT3. The pitch PT3 of the scanning lines G is equal to the pitch PT1 of the strip portions 41. One light emitting element LD is arranged over a plurality of strip portions 41 and a plurality of scanning lines G aligned along the first direction X.

Note that in the example illustrated, the number of scanning lines G and the number of strip sections 41 are equal to each other, but the number of scanning lines G may be an integral multiple of two or more times the number of strip sections 41.

In such a configuration example as well, advantageous effects similar to those of the configuration example shown in FIG. 4 can be obtained.

Figure 14:
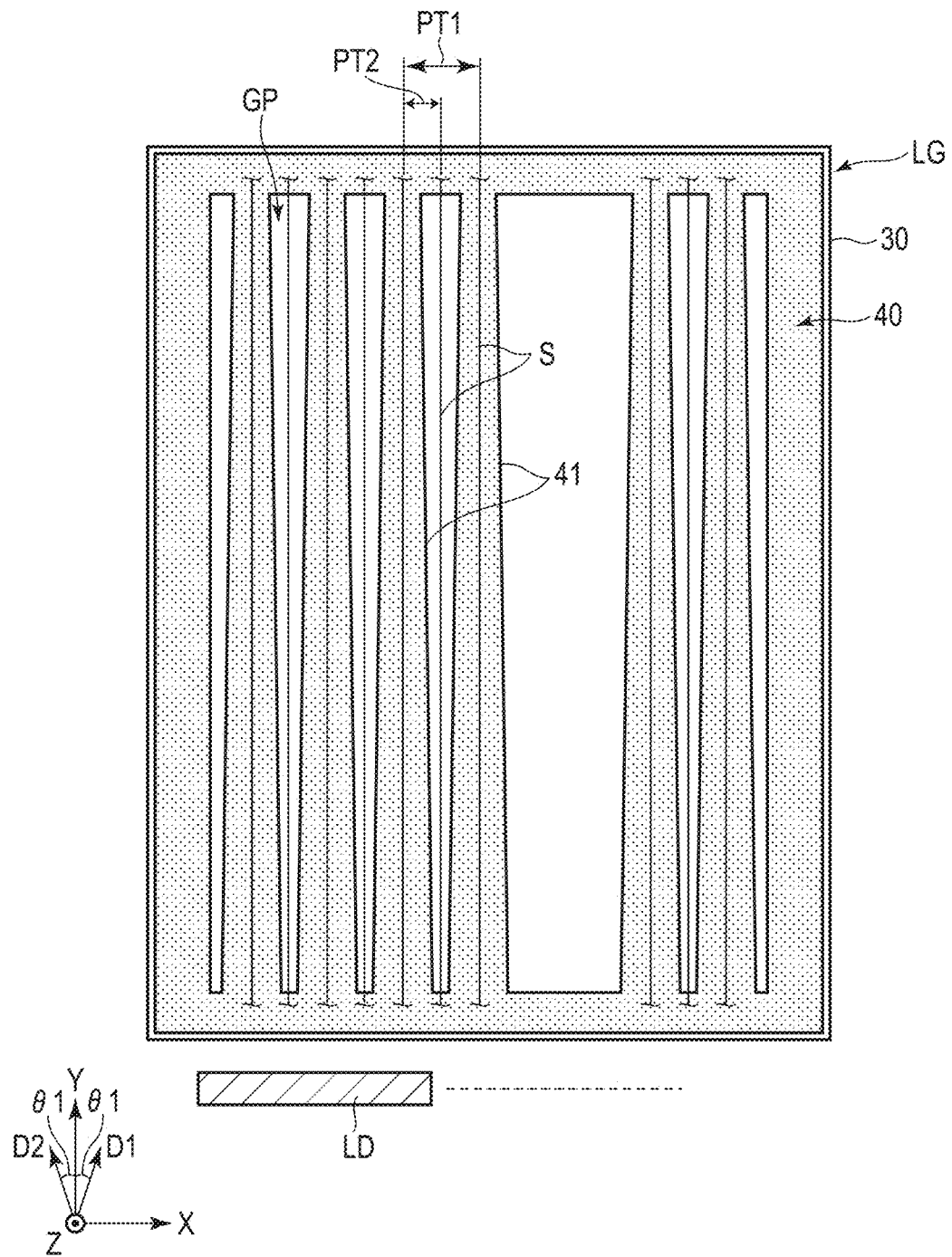
FIG. 14 is a plan view showing still another configuration example of the light guide element shown in FIG. 4.

FIG. 14 is a plan view of another configuration example of the light guide element LG shown in FIG. 4. The configuration example shown in FIG. 14 differs from that of FIG. 4 in the number of signal lines S.

In the example illustrated, the number of signal lines S is twice as many as the number of strip portions 41. Thus, the number of signal lines S may be an integer multiple of two or more with respect to the number of strip sections 41. The pitch PT1 of the strip portions 41 is twice the pitch PT2 of the signal lines S. Thus, the pitch PT1 of the strip portions 41 may be an integer multiple of two or more times with respect to the pitch PT2 of the signal lines S. Some of the plurality of signal lines S overlap the plurality of strip sections 41 and extend in the same direction, while other portions are located in the gaps GP between respective adjacent pairs of strip sections 41.

In such a configuration example as well, advantageous effects similar to those of the configuration example shown in FIG. 4 can be obtained.

FIG. 15 is a plan view showing a configuration example in which the transparent layer 40 and the first substrate SUB1 overlap each other. Note here that the frame portion 42 of the transparent layer 40 is illustrated and the strip portions 41 are omitted from the figure.

A plurality of scanning lines G and a plurality of signal lines S are led from the display area DA out to the non-display area NDA. For example, the odd-numbered scanning lines G are lead out between the edge portions E13 and the display area DA, respectively, and the even-numbered scanning lines G are lead out between the edge portions E14 and the display area DA, respectively.

The first substrate SUB1 comprises a power line P. The power supply line P is, for example, a wiring line for supplying a common voltage (Vcom) and is electrically connected to the capacitive electrode 13 shown in FIG. 2. Further, the power supply line P is connected to the power supply terminal PT at a corner portion of the first substrate SUB1. A power feed terminal PT is electrically connected to the common electrode CE of the second substrate SUB2 via a conductive material not shown. The power supply line P and the power feed terminal PT are located in the non-displayed portion NDA, and the power feed terminal PT is located outside of the seal SE shown in FIG. 1, which will not be described in detail. The power supply line P may be located inside the seal SE or may overlap the seal SE.

The plurality of scanning lines G, the plurality of signal lines S and the power supply line P are electrically connected to the IC chip 1 or the wiring board 2 shown in FIG. 1 between the edge portion E11 and the display DA.

In plan view, the third portion 423 and the fourth portion 424 of the frame portion 42 of the transparent layer 40 respectively overlap the scanning lines (second wiring lines) G located in the non-display area NDA. The first portion 421 overlaps the scanning lines G and the signal lines S in the non-displayed portion NDA. Further, the frame portion 42 overlaps the power supply line P and the power feed terminal PT.

According to this example configuration, light from the light emitting elements LD can be suppressed from being made incident on various wiring lines located in the non-displayed portion NDA, and thus it is possible to suppress degradation of the display quality, which may be caused due to absorption in the various wiring lines or undesired scattering in the various wiring lines.

FIG. 16 is a plan view showing a configuration example in which the transparent layer 40 and the seal SE overlap each other. Note that the frame portion 42 of the transparent layer 40 is illustrated in the figure, and the strip portions 41 are omitted from the illustration. In plan view, the frame portion 42 of the transparent layer 40 overlaps the seal SE.

According to such an example configuration, it is possible to suppress the light from the light emitting element LD from being made incident on the seal SE located in the non-display area NDA. Thus, the degradation of the display quality, which is caused due to undesired scattering at the seal SE can be suppressed.

As explained above, according to this embodiment, it is possible to obtain a display device which can suppress the degradation of the display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate comprising a first transparent substrate, a plurality of first wiring lines aligned along a first direction and extending in a second direction intersecting the first direction, switching elements electrically connected to the first wiring lines, respectively and pixel electrodes electrically connected to the switching elements, respectively;
a second substrate comprising a second transparent substrate and a common electrode opposing the pixel electrodes;
a liquid crystal layer held between the first substrate and the second substrate and containing polymers and liquid crystal molecules;
a plurality of light emitting elements aligned along the first direction; and
a light guide element comprising a third transparent substrate including a main surface and a side surface opposing the plurality of light emitting elements, and a transparent layer disposed on the main surface and having a refractive index lower than a refractive index of the third transparent substrate, wherein
the third transparent substrate is bonded to the first transparent substrate or the second transparent substrate while interposing the transparent layer therebetween,
the transparent layer comprises a plurality of strip portions aligned along the first direction and extending in the second direction,
the strip portions include a first end portion on a side opposing the light emitting elements, a second end portion on an opposite side to the first end portion, and a middle portion between the first end portion and the second end portion,
the first end portion has a first width greater than a width of the middle portion,
the second end portion has a second width greater than the width of the middle portion, and
one of the plurality of first wiring lines overlaps a corresponding one of the plurality of strip portions.

2. The display device of claim 1, wherein
each of the plurality of strip portions overlaps a corresponding one of the plurality of first wiring lines and does not overlap others of the plurality of first wiring lines.

3. The display device of claim 1, wherein
the first wiring lines are signal lines.

4. The display device of claim 1, wherein
the first wiring lines are scanning lines.

5. The display device of claim 1, wherein
a number of the first wiring lines is equal to a number of the strip portions, and
a pitch of the first wiring lines is equal to a pitch of the strip portions.

6. The display device of claim 1, wherein
the strip portions each further comprise a first edge and a second edge, and
each of the first edge and the second edge extends in a direction different from the first direction and the second direction between the first end portion and the second end portion.

7. The display device of claim 1, wherein
a third width of a gap between each adjacent pair of the first end portions is smaller than the first width,
a fourth width of a gap between each adjacent pair of the second end portions is smaller than the second width, and
the third width is smaller than the fourth width.

8. The display device of claim 1, wherein
in plan view, the pixel electrode overlaps an adjacent pair of the strip portions.

9. The display device of claim 1, further comprising:
a display area for displaying images and a non-display area surrounding the display area, wherein
the transparent layer further comprises a frame portion surrounding the plurality of strip portions, and
the plurality of strip portions overlap the display area and the frame portion overlaps the non-display area in plan view.

10. The display device of claim 9, further comprising:
a plurality of second wiring lines intersecting the first wiring lines, wherein
the frame portion includes a first portion and a second portion extending along the first direction and a third portion and a fourth portion extending along the second direction,
the first portion is connected to the first end portion and the second portion is connected to the second end portion, and
the third portion and the fourth portion overlap the second wiring lines located in the non-display area in plan view.

11. The display device of claim 9, further comprising:
a seal that adheres the first substrate and the second substrate together and seals the liquid crystal layer, wherein
the seal is located in the non-display area, and
the frame portion overlaps the seal in plan view.

12. The display device of claim 1, wherein
one of the light emitting elements is opposed to the plurality of strip portions and the plurality of first wiring lines.

13. A display device comprising:
a first substrate comprising a first transparent substrate, a plurality of first wiring lines aligned along a first direction and extending in a second direction intersecting the first direction, each of the plurality of first wiring lines being connected to a switching element;
a second substrate comprising a second transparent substrate;
a liquid crystal layer held between the first substrate and the second substrate;
a plurality of first light emitting elements aligned along the first direction; and
a light guide element comprising a third transparent substrate including a main surface and a first side surface opposing the plurality of first light emitting elements, and a transparent layer disposed on the main surface and having a refractive index lower than a refractive index of the third transparent substrate, wherein
the first substrate is disposed between the second substrate and the transparent layer, or the second substrate is disposed between the first substrate and the transparent layer,
the transparent layer comprises a plurality of strip portions aligned along the first direction and extending in the second direction, the strip portions include a first end portion opposing the first side surface, a second end portion on an opposite side to the first end portion, and a middle portion between the first end portion and the second end portion, the first end portion has a first width greater than a width of the middle portion, the second end portion has a second width different from the width of the middle portion, and each of the plurality of strip portions overlaps a corresponding one of the plurality of first wiring lines and does not overlap others of the plurality of first wiring lines.

14. The display device of claim 13, further comprising a plurality of second light emitting elements aligned along the first direction, wherein the third transparent substrate includes a second side surface opposing the plurality of second light emitting elements, and the main surface is located between the first side surface and the second side surface.

15. The display device of claim 14, wherein the second end portion opposing the second side surface, and the second width is greater than the width of the middle portion.

16. The display device of claim 13, wherein the strip portions each further comprise a first edge and a second edge, and each of the first edge and the second edge extends in a direction different from the first direction and the second direction between the first end portion and the second end portion.

17. The display device of claim 13, wherein a third width of a gap between each adjacent pair of the first end portions is smaller than the first width, a fourth width of a gap between each adjacent pair of the second end portions is smaller than the second width, and the third width is smaller than the fourth width.

18. The display device of claim 13, wherein the liquid crystal layer includes strip-like polymers and liquid crystal molecules.

19. The display device of claim 13, wherein pixel electrodes are disposed on the first substrate, and a common electrode is disposed on the second substrate and opposes the pixel electrodes.

20. The display device of claim 13, wherein the liquid crystal layer is configured to switch between a scattering state and a transmission state.

* * * * *